US009910161B1

United States Patent
Tonami et al.

(10) Patent No.: US 9,910,161 B1
(45) Date of Patent: Mar. 6, 2018

(54) RADIATION DETECTOR

(71) Applicant: SHIMADZU CORPORATION, Kyoto-shi, Kyoto (JP)

(72) Inventors: Hiromichi Tonami, Kyoto (JP); Masafumi Furuta, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 15/499,413

(22) Filed: Apr. 27, 2017

(51) Int. Cl.
*G01T 1/20* (2006.01)
*G01T 1/16* (2006.01)
*G01R 33/48* (2006.01)
*G01T 1/29* (2006.01)

(52) U.S. Cl.
CPC .......... *G01T 1/1603* (2013.01); *G01R 33/481* (2013.01); *G01T 1/2002* (2013.01); *G01T 1/2018* (2013.01); *G01T 1/2985* (2013.01)

(58) Field of Classification Search
CPC .................................................. G01T 1/1644
See application file for complete search history.

(56) References Cited

U.S. PATENT DOCUMENTS

| | | | | |
|---|---|---|---|---|
| 7,626,389 B2 * | 12/2009 | Fiedler | ................... | G01R 33/28 324/307 |
| 8,448,327 B2 * | 5/2013 | Tonami | ................. | G01T 1/1644 29/592.1 |
| 2004/0232342 A1 * | 11/2004 | Aykac | ................... | G01T 1/2002 250/367 |
| 2009/0310735 A1 * | 12/2009 | Tonami | ................. | G01T 1/1603 378/5 |
| 2010/0072398 A1 * | 3/2010 | Fruehauf | ................... | G01T 1/00 250/487.1 |
| 2010/0237251 A1 * | 9/2010 | Tonami | ................. | G01T 1/1642 250/368 |
| 2011/0113611 A1 * | 5/2011 | Tonami | ................. | G01T 1/1644 29/428 |
| 2013/0284936 A1 * | 10/2013 | McBroom | ............ | G01R 33/481 250/363.03 |

(Continued)

FOREIGN PATENT DOCUMENTS

| | | |
|---|---|---|
| JP | 2013-152232 | 8/2013 |
| JP | 2013-231719 | 11/2013 |

(Continued)

OTHER PUBLICATIONS

"Time-of-Flight PET-MR Detector Development with Silcon Photomultipler"; PSMR2012, GE: Healthcare, Inc., Publication, p. 21.

*Primary Examiner* — Marcus Taningco
(74) *Attorney, Agent, or Firm* — Andrew F. Young, Esq.; Lackenbach Siegel, LLP

(57) ABSTRACT

A radiation detector for a PET-MR apparatus, has a fastening-strength and a high cooling efficiency relative to a photoelectric conversion element. A holding member 31 holds a side-periphery and a bottom of a light detector 7 by a connection element 31*a*, and is strongly fastened by a connection base 27 and a gimlet hole 31*b* and a screw 33. A light shielding film 35 is a thin-film and adheres and covers an outer-periphery and the side-periphery of the holding member 31. The radiation detector has a robust fastening-strength, so that a locational shift of the scintillator block 3 is prevented. As a result, the radiation detector can detect γ-ray data accurately.

7 Claims, 10 Drawing Sheets

(56) References Cited

U.S. PATENT DOCUMENTS

| | | | | |
|---|---|---|---|---|
| 2014/0091225 A1* | 4/2014 | Sasaki | ............... | G01T 1/202 |
| | | | | 250/366 |
| 2015/0285923 A1* | 10/2015 | Tonami | ............... | G01T 1/249 |
| | | | | 250/368 |
| 2016/0187496 A1* | 6/2016 | Bradford | ............... | G01T 1/2985 |
| | | | | 250/366 |

FOREIGN PATENT DOCUMENTS

| WO | WO2009/139039 | 11/2009 |
|---|---|---|
| WO | WO 2010/010608 | 1/2010 |

\* cited by examiner

RADIATION DETECTOR

CROSS REFERENCE TO RELATED APPLICATIONS

This application relates to, but does not claim priority from, JP 2014-215290 filed Oct. 22, 2014, the entire contents of which are incorporated herein by reference.

FIGURE SELECTED FOR PUBLICATION

FIG. 1

BACKGROUND OF THE INVENTION

Field of the Invention

The present invention relates to a radiation detector applied to a combined apparatus for positron emission tomography and magnetic resonance tomography to obtain a nuclear medicine image and a magnetic resonance image at the same time.

Description of the Related Art

Conventionally, a positron emission tomography (PET) is known as a medical imaging. Positron emission tomography apparatus, i.e., PET apparatus is an apparatus that generates PET image showing distribution of radiopharmaceuticals labeled with a positron-emitting radionuclide inside a subject.

A PET apparatus comprises multiple radiation detectors arranged as circularly surrounding a subject. The radiopharmaceuticals administered to the subject is accumulated in a target (examination) region and the cumulative pharmaceuticals emits a positron. The emitted positron annihilates with an electron and generates a pair of γ-rays having an exact opposite momentum to each other. A pair of γ-rays is emitted to the opposite direction to each other and the respective γ-rays are simultaneously detected by the radiation detectors. The location of the radiopharmaceuticals is calculated based on the data of the detected γ-rays and the PET apparatus provides an image showing the distribution of the radiopharmaceuticals relative to the target region.

On the other hand, a magnetic resonance tomography apparatus (MR apparatus) is known as well as the PET apparatus as the medical imaging apparatus and the image taken by the MR apparatus is suitable for an anatomical examination. Recently, the magnetic resonance tomography apparatus (MR apparatus) is combined with the PET apparatus to acquire the image suitable for both physiological examination and anatomical examination and the combined (co-registered) may be applied as a positron emission tomography-magnetic resonance tomography apparatus.

In such case, as a light receiving element (photoelectric conversion element) applied to the radiation detector can be an element such as SiPM (Silicon Photo Multiplier) and APD (Avalanche Photo Diode) and so forth. SiPM element and APD element are not affected by the strong magnetic field emitted from the MR apparatus, so that a PET-MR using the SiPM and so forth as the light receiving element is disclosed (e.g., refer to Patent Document 1-3).

The inventor sets forth the configuration of a PET apparatus. Referring to FIG. 9, the conventional PET apparatus comprises a gantry 53 having a hole (ring) 52 in which a subject is introduced. The gantry 53 inside comprises multiple radiation detectors 55 that is circularly arranged as if surrounding the hole 52, a chassis 57 holding the respective radiation detectors 55, connection bases 59 that connect the respective radiation detectors 55 to the chassis 57.

Further, configurations of the radiation detector 55 applied to the conventional PET apparatus 51 is disclosed in Patent Document 4 and Non-Patent Document 1. Referring to FIG. 10A, the conventional radiation detector 55 comprises a layered structure including an upper-layer of a scintillator block 61, and a light guide and a light detector 65 in order. In addition, relative to the radiation detector 55, the upper-layer is the side closer to the hole 52 installed to the PET apparatus 51 for the subject M and the lower side closer to a chassis 57 installed in the PET apparatus 51.

The scintillator block 61 has a structure, in which rectangular parallelepiped scintillator crystals 61a are arranged two-dimensionally, and emits light by absorbing a γ-ray emitted from the subject M. In addition, the light emitted at the scintillator block 61 is specified as a scintillator light. The light guide 63 photochemically connects the scintillator block 61 and the light detector 65 respectively and transmits the scintillator light to the light detector 65.

The light detector 65 comprises cumulated photoelectric conversion layer 67 on the one side of the printed substrate 69 and connects the photoelectric conversion layer 67 and the light guide 63. Photoelectric conversion elements such as SiPM and APD and so forth, which are not impacted by the magnetic field, are arranged two-dimensionally in the photoelectric conversion layer 67. The photoelectric conversion element constituting the photoelectric conversion layer 67 detects the scintillator lights transmitted by the light guide 63 and converts the scintillator light to an electric signal.

Generally, an integrated circuit 71, e.g., ASIC (application specific integrated circuits) and multiple screw holes (receivers) 73 are installed on the other side of the printed substrate 69. Specifically, the photoelectric conversion layer 67, the printed substrate 69 and the integrated circuit 71 are layered from the upper-layer to the lower-layer in order. The integrated circuit 71 sends the electric signal converted by the photoelectric conversion layer 67 to a signal processing circuit set forth later.

A thermal sheet 75 and a cover plate 77 are layered in order in the lower-layer of the integrated circuit 71. Gimlet holes 75a and 77a are installed to the respective thermal sheets 75 and the cover plates 77. Consequently, the printed substrate 69, the thermal sheet 75 and the cover plate 77 are connected by screwing the screw 79 into the the screw hole 73. The thermal sheet 75 is made of a thermal conductive material.

Each outer-periphery (circumference) of the scintillator block 61, the light guide 63, the light detector 65 and the thermal sheet 75 is covered by a light shielding case 80. For example, the light shielding case 80 is made of black plastic and can block the incident light from the outside of the PET apparatus 51 to the inside of the radiation detector 55. In addition, the light shielding case 80 can protect the radiation detector 55 from the impact shock and so forth.

A cooling plate 81 and a signal processing substrate 83 are layered in order in the lower-layer than the cover plate 77. The signal processing substrate 83 is connected to the connection base 59. In addition, the cover plate 77, the cooling plate 81, the signal processing substrate 83 and the connection base 59 are connected to each other by screwing with a screw or by connecting with a relief (concave-convex) structure.

A tube (not shown in FIG.) which a cooling medium circulates inside is installed inside the cooling plate 81. The signal processing substrate 83 comprises a signal processing circuit (not shown in FIG.) The signal processing circuit reads out the electric signal output from the photoelectric conversion layer 67 via the integrated circuit 71. A tomographic image showing the distribution of positron emission radionuclides at the target region is generated based on the read-out electric signal. In such way, the PET apparatus 51 generates the radiation image (radiograph) suitable for the biochemical examination relative to the specific organs and tumors.

The structural material of any components of the PET apparatus, even including the radiation detector 55, is a nonmagnetic material, i.e., a nonmagnetic metal, e.g., copper and aluminum, or nonmetal. Particularly, the photoelectric conversion element constituting the photoelectric conversion layer 67 is the element not impacted by the magnetic field. Accordingly, a user can use the PET apparatus in combination with a MR apparatus as a PET-MR apparatus.

RELATED PRIOR ART DOCUMENTS

Patent Document

Patent Document 1: WO 2009/139039 A1
Patent Document 2: WO 2010/010608 A1
Patent Document 3: JP 2014-152232 A1
Patent Document 4: JP 2013-231719 A1
Non-Patent Documents: Non-Patent Document 1
"Time-of-Flight PET-MR Detector Development with Silicon Photomultiplier" PSMR2012; GE Healthcare, Inc., Publication, p 21.

ASPECTS AND SUMMARY OF THE INVENTION

Objects to be Solved

Nevertheless, in the case of a conventional example having such structure, following problems are remained to be solved.

Firstly, according to the conventional radiation detector, a cooling efficiency is poor relative to the photoelectric conversion element. When the conventional radiation detector 55 is used, the photoelectric conversion element must be cooled because of preventing an occurrence of noise and so forth. Consequently, a cooling plate 81 is installed to the radiation detector 55 and the cooling plate 81 cools the photoelectric conversion layer 67 through a thermal sheet 75 and so forth.

However, relative to a light detector 65, the integrated circuit 71 is generally installed to the other surface of the printed substrate 69. Therefore, according to the structure of the conventional PET apparatus, the cooling plate 81 cannot cool the photoelectric conversion layer 67 unless the integrated circuit 71, which is a main heat-source, is cooled. Accordingly, not only the photoelectric conversion layer 6, but also the cooling plate 81 must be intensively cooled to cool the integrated circuit 71 as well.

In addition, gimlet holes 75a and 77a are installed to the thermal sheet 75 and the cover plate 77. The thermal conductivity at the gimlet hole is extremely low, so that the cooling efficiency relative to the photoelectric conversion layer 67 becomes further worse. When the cooling plate 81 is intensively cooled to compensate the worsened cooling efficiency, it is a problematic concern that dew condensation in the periphery of the cooling plate 81 takes place due to supercooling of the cooling plate 81.

Secondly, it is also a problematic concern that the conventional radiation detector 55 can hardly assure the structurally sufficient strength for fastening. The radiation detector 55 comprising the heavy scintillator block 61 must be ensured to have the structurally sufficient strength for fastening.

The conventional radiation detector 55 comprises the printed substrate 69, the thermal sheet 75 and the cover plate 77 that are connected by screwing for the purpose to be taken apart for inspection and repair. However, according to the practical aspect thereof, the integrated circuit 71 occupies the most part of the rear surface (back side) of the printed substrate 69. Consequently, the mountable area for the screw hole is extremely narrow and limited on the printed substrate 69.

In such scenario, the number and the size of of the screws 79 is limited in accordance with limit of the mountable area for the screw holes 73. In addition, the printed substrate 69 having the screw holes 73 is thin, so that the printed substrate 69 can become uneven when the respective screws 70 are fastened with strong force to compensate the limits of the number and the size. Accordingly, it is hard to ensure a sufficient fastening force between the printed substrate 69 and the cover plate 77. Consequently, the problem in which each component of the radiation detector 55 may be apart and the problem in which the data of the γ-ray cannot be detected accurately due to a locational shift of the scintillator block 61 take place.

In addition, according to the conventional radiation detector 55, the screw 70 and the screw hole are made of a nonmagnetic metal and installed near by the integrated circuit 71. In such case, the metal forming the screw 79 and the screw hole 73 affects the alternating magnetic field, so that it is a problematic concern that noise relative to the PET-MR apparatus takes place when the radiation detector 55 is applied to the PET-MR apparatus.

Lastly, according to the conventional radiation detector 55, it is a problematic concern that it can be hard to arrange the radiation detectors so that the distance between the adjacent radiation detectors is adequate. Referring to FIG. 10B, an array pitch of a scintillator crystal 61a in the scintillator block 61 is specified as Da.

The apart distance Db between scintillator blocks 61 is preferably an integral multiplication of the array pitch Da relative to the adjacent radiation detectors to each other. In addition, the shorter apart distance Db is preferable to increase the detection sensitivity of the γ-ray.

The ideal value of the apart distance is e.g., 3 mm to satisfy both conditions. Nevertheless, the conventional radiation detector 55 is covered by the light shielding case 80. A plastic forming the light shielding case 80 has some thickness, so that the apart distance Db between the scintillator blocks 61 can be longer than the ideal value. Consequently, the detection sensitivity of the γ-ray using the conventional apparatus can be lowered.

The present invention has been completed considering such facts. Specifically, a purpose of the present invention is to provide a radiation detector that is feasible for a PET-MR apparatus, has a satisfactory fastening-strength from the structure standpoint, and a high cooling efficiency relative to a photoelectric conversion element.

Means for Solving the Problem

The present invention constitutes the following structure to solve such problems.

Specifically, a radiation detector of the present invention comprises: a scintillator block that comprises two-dimensionally arranged block scintillator crystals, detects an incident radiation and emits light; a light guide that is photochemically connected to the scintillator block and transmits the light emitted from the scintillator block; a light detector that comprises a photoelectric conversion element that converts the transmitted light from the light guide to an electric signal and is photochemically connected to the light guide; a holding member having a connection element that are installed to the respective side-peripheries of the light detector, the light guide and the scintillator block and connects and holds the side-periphery of the light detector and a bottom and a base fastening element that is fastened with base elements installed to the location facing the scintillator block and sandwiching the light detector; and a light shielding thin-film member with an adhesive property that covers the outer-periphery of the scintillator block and the side-periphery of the holding member.

[Action and Effect]

The radiation detector of the present invention comprises the holding member and the light shielding member. The holding member that are installed to the respective side-peripheries of the light detector, the light guide, and the scintillator block comprises connection members and base fastening members. The connection members connect and hold the side-periphery of the light detector and the bottom, so that a location shift of the light detector can be adequately and effectively prevented. The light detector photochemically connects the scintillator block and the light guide, so that the location shift of the scintillator block can be adequately and effectively prevented by the holding members.

The holding members are fastened with the base elements installed to the location sandwiching the light detector and facing the scintillator lights through the base fastening member. In such case, the design of the base fastening member is facilitated to fasten the base members and the holding members more strongly. The base members and the holding members are fastened strongly, so that the holding member can hold more stably the light detectors. Accordingly, the fastening strength of the radiation detectors can be stronger.

The light shielding member having the adhesive property covers the outer-periphery of the scintillator block and the side-periphery of the holding member. In such case, the light shielding member connects strongly the holding member and the scintillator block, respectively. Specifically, the light shielding member connects and fixes the holding member and the scintillator block in a unified manner. Accordingly, the radiation detector, as a whole, can have a robust fastening-strength, so that the locational shift of the scintillator block can be adequately and effectively prevented. The location of the scintillator block consequently becomes stable, so that the radiation detector can detect the γ-ray data more accurately.

In addition, the light shielding member is like a thin-film, so that the apart distance between the adjacent scintillator blocks per se can be set ideally as short even when the scintillator block is covered by the light shielding member. The apart distance between the scintillator blocks per se becomes short, so that a non-detectable area of γ-rays can be much narrower. Consequently, both preventing adequately the radiation detector from the outside light and keeping the high detection sensitivity of the γ-rays by the radiation detector can be accomplished.

According to the present invention set forth above, it is preferable that a cooling layer comprising a cooling means that cools the photoelectric conversion elements is tightly connected to the light detector, and an integrated circuit substrate comprising the integrated circuit that sends the electric signal converted by the photoelectric conversion element, and the integrated circuit substrate 21 is connected to the light detector through a connection element and placed in the not-contact location of the cooling layer.

[Action and Effect]

According to the radiation detector of the present invention, the integrated circuit substrate, and the cooling layer tightly connected to the light detector. The cooling layer comprises the cooling means that cools the photoelectric conversion elements. The cooling layer is tightly connected to the light detector, so that the photoelectric conversion element constituting the light detector can be adequately and effectively cooled. In addition, the integrated circuit substrate comprising the integrated circuit, which is a main heat source, is placed in the non-contact location of the cooling layer. In such case, conduction of heat generated by the integrated circuit is adequately and effectively prevented, so that cooling efficiency of the cooling means relative to the photoelectric conversion element can be higher. Consequently, an occurrence of dew condensation due to super-cooling of the cooling means in the radiation detector can be adequately and effectively prevented.

According to the present invention set forth above, it is preferable that the cooling layer comprises the cooling means and the thermal conductive sheet formed by the thermal conductive resin and the cooling means is tightly connected to the light detector through the thermal conductive sheet.

[Action and Effect]

According to the radiation detector of the present invention, the cooling layer comprises the cooling means and the thermal conductive sheet, and the cooling means is tightly connected to the light detector through the thermal conductive sheet. The thermal conductive sheet is made of the resin, so that the tightness between the cooling means and the light detector can be much higher. And heat of the light detector is adequately and effectively conducted to the cooling means and diffused through the thermal conductive sheet having thermal conductivity. According to such aspects, the cooling efficiency for the photoelectric conversion element of the radiation detector can be much higher.

According to the present invention set forth above, it is preferable that the photoelectric conversion element is a SiPM element or an ADP element.

[Action and Effect]

According to the radiation detector of the present invention, the SiPM element or the ADP element is applied to the photoelectric conversion element. Such elements are not affected by the magnetic field caused by the magnetic resonance tomography apparatus (MR apparatus). Therefore, the radiation detector of the present invention can be applied to the combined apparatus for positron emission tomography and magnetic resonance tomography (PET-MR).

According to the present invention set forth above, it is preferable that the light shielding member comprises a light shielding layer made of black polyethylene terephthalate and an adhesive layer made of an adhesive material, and the light shielding member covers the outer-periphery of the scintillator block and the side-periphery of the holding member through the adhesive layer.

[Action and Effect]

According to the radiation detector of the present invention, the light shielding member comprises the light shielding layer made of black polyethylene terephthalate (PET) and the adhesive layer. The black PET is a material having high strength and a light shielding property despite a thin-film so that the thickness of the light shielding layer can be much thinner. Specifically, the apart distance between the adjacent scintillator blocks per se can be set ideally short even when the scintillator block is covered by the light shielding member. Consequently, both protecting adequately and effectively the radiation detector from an impact shock and the outside light and keeping the high detection sensitivity of the γ-rays by the radiation detector can be accomplished.

According to the present invention set forth above, it is preferable that the holding member has a taper-shaped form being thicker from the side-periphery of the scintillator block toward the side-periphery of the light detector.

[Action and Effect]

According to the radiation detector of the present invention, the holding member has a taper-shaped form being thicker from the side-periphery of the scintillator block toward the side-periphery of the light detector. In such case, the part covering the side-periphery of the scintillator block is thick, so that the contact area between the shielding member covering the scintillator block and the holding member and the holding member can be much larger. In such case, the shielding member, the holding member and the scintillator block are connected more strongly to each other. Consequently, the fastening strength of the radiation detectors can be much higher.

According to the present invention set forth above, it is preferable that the holding member is made of a resin having an insulation property and the light shielding property.

[Action and Effect]

According to the radiation detector of the present invention, the holding member is made of a resin having an insulation property and the light shielding property. In such case, the holding member blocks the light from the outside of the radiation detector as well as the light shielding member. In addition, the resin forming the holding member can protect the radiation detector from the impact shock and so forth. Consequently, an influence that the radiation detector would receive the impact shock and the outside light can be adequately and effectively lessened.

Effect of the Invention

Specifically, a radiation detector of the present invention comprises the holding member and the light shielding member. The holder member that are installed to the respective side-peripheries of the light detector, the light guide, and the scintillator block comprises connection members and base fastening members. The connection members connect and hold the side-periphery of the light detector and the bottom, so that a location shift of the light detector can be adequately and effectively prevented. The light detector photochemically connects the scintillator block and the light guide, so that the location shift of the scintillator block can be adequately and effectively prevented by the holding members.

The holding members are fastened with the base elements installed to the location sandwiching the light detector and facing the scintillator lights through the base fastening member. In such case, the design of the base fastening member is facilitated to fasten the base members and the holding members more strongly. The base members and the holding members are fastened strongly, so that the holding member can hold more stably the light detectors. Accordingly, the fastening strength of the radiation detectors can be much stronger.

The light shielding member having the adhesive property covers the outer-periphery of the scintillator block and the side-periphery of the holding member. In such case, the light shielding member connects strongly the holding member and the scintillator block, respectively. Specifically, the light shielding member connects and fixes the holding member and the scintillator block in a unified manner. Accordingly, the radiation detector, as a whole, can have a robust fastening-strength, so that the locational shift of the scintillator block can be adequately prevented. The location of the scintillator block consequently becomes stable, so that the radiation detector can detect more accurately the γ-ray data.

In addition, the light shielding member is like a thin-film, so that the apart distance between the adjacent scintillator blocks per se can be set ideally as short even when the scintillator block is covered by the light shielding member. The apart distance between the scintillator blocks per se becomes short, so that a non-detectable area of γ-rays can be much narrower. Consequently, both protecting adequately the radiation detector from the outside light and keeping the high detection sensitivity of the γ-rays by the radiation detector can be accomplished.

The above and other aspects, features and advantages of the present invention will become apparent from the following description read in conjunction with the accompanying drawings, in which like reference numerals designate the same elements.

BRIEF DESCRIPTION OF THE DRAWINGS

FIG. 4A is a front view of the connection base from the z-direction when connected to the radiation detector, and FIG. 4B is a front view of the connection base from the z-direction when not connected to the radiation detector.

FIG. 10A is a vertical cross-section view illustrating an entire structure of a radiation detector, and FIG. 10B is a schematic view illustrating an apart distance of the adjacent radiation detectors.

DETAILED DESCRIPTION OF THE PREFERRED EMBODIMENTS

Figure 1:
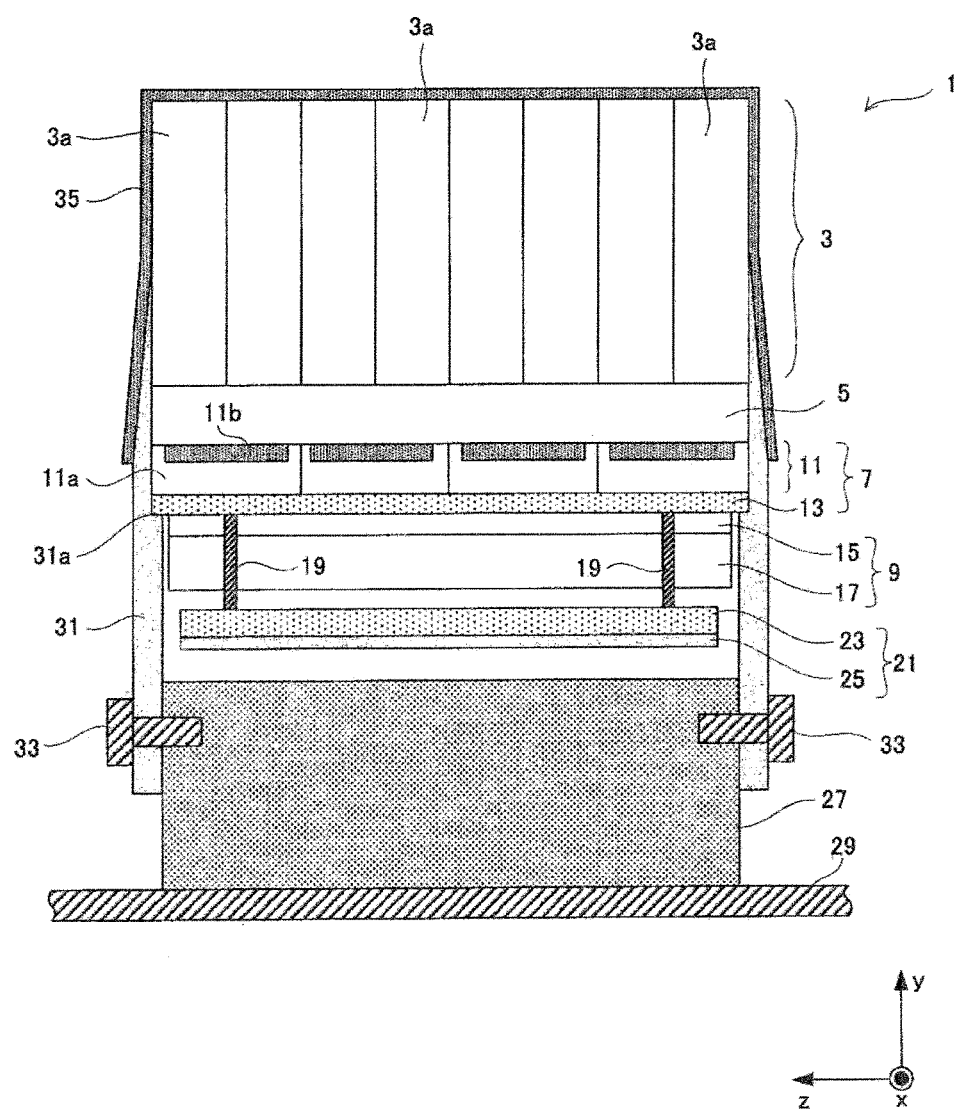
FIG. 1 is a vertical cross-section view illustrating an entire structure of a radiation detector according to the aspect of the Embodiment.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Figure 6A:
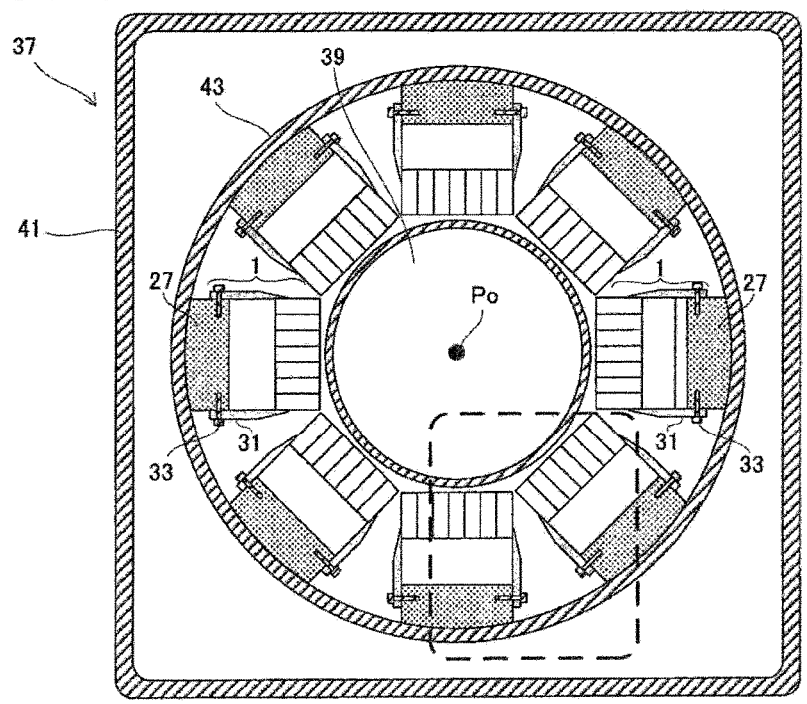
FIG. 6A is a vertical cross-section view of the yz-plane relative to the PET apparatus according to the aspect of the Embodiment.
Figure 6B:
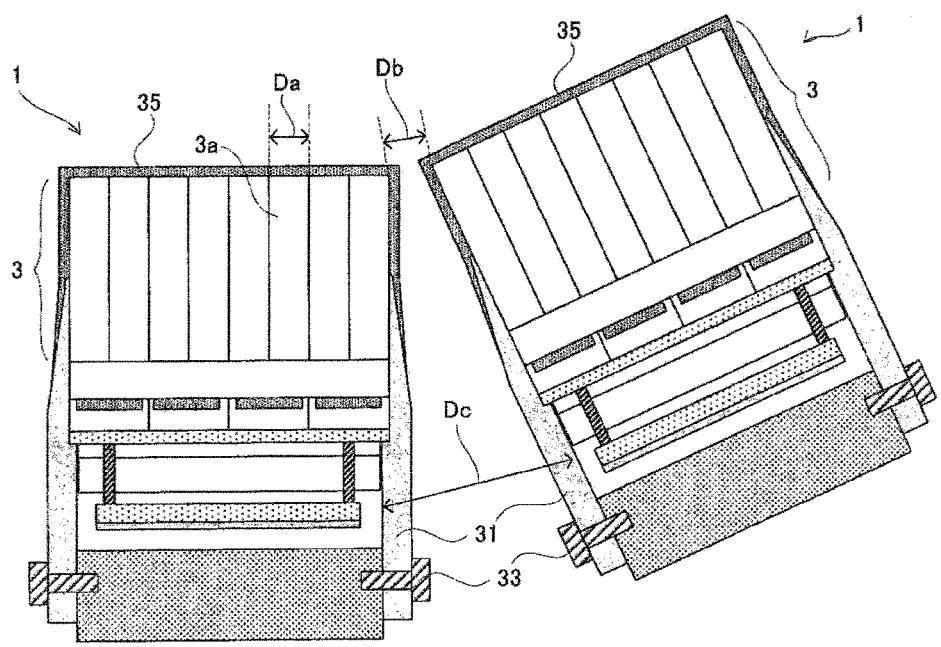
FIG. 6B is a schematic view illustrating an apart distance of the adjacent radiation detectors relative to the PET apparatus according to the aspect of the Embodiment.
Figure 9:
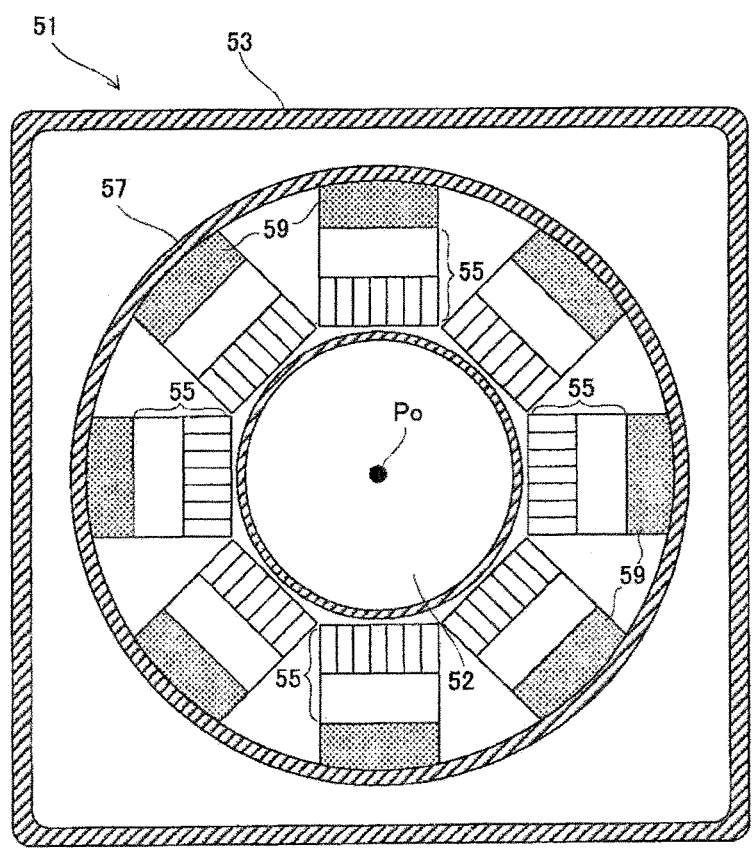
FIG. 9 is a vertical cross-section view illustrating an entire structure of a conventional PET apparatus according to an aspect of the conventional example.

Referring to Figures, the inventors illustrate Embodiment of the present invention. FIG. 1 is a vertical cross-section view illustrating a radiation detector 1 according to the aspect of the Embodiment. In addition, a schematic structure of the PET apparatus comprising the radiation detector according to the aspect of the Embodiment is the same as the conventional example referring to FIG. 9, so that the detail is set forth later. In addition, the direction in which a hole to introduce the subject into the PET apparatus is extending is specified as the x-direction relative to the radiation detector 1. And the direction toward the center Po of the hole installed to the PET apparatus is specified as the y-direction (FIG. 6, FIG. 9). The orthogonal direction to both x-direction and y-direction is specified as the z-direction.

(Illustration of the Entire Structure)

Referring to FIG. 1, the radiation detector 1 according to the aspect of the Embodiment comprises a layered structure including a scintillator block 3, a light guide 5, a light detector 7 and a cooling layer 9 from the upper-layer to the lower-layer in order. In addition, relative to the radiation detector 1, the upper-layer is the side closer to the hole installed to the PET apparatus for the subject and the lower side closer to a chassis installed in the PET apparatus. In addition, relative to the radiation detector 1, the y-direction coincides with the direction in which the respective components, including the scintillator block 3 and so forth, are layered.

The scintillator block 3 has a structure, in which rectangular parallelepiped scintillator crystals 3a are arranged two-dimensionally in the x-direction and the y-direction, and emits scintillator lights by absorbing γ-rays emitted from the subject M. The respective scintillator crystals 3a are optically connected by the clear (transparent) thermosetting resin and so forth. The material forming the scintillator crystals 3a is, for example, a crystal selected from the group consisting of LYSO, LSO, LGSO and BGO and so forth.

The light guide 5 that is made of the optical member having high clarity transmits the scintillator lights emitted from the scintillator block 3 to the light detector 7. The respective scintillator block 3, the light guide 5 and the light detector 7 are optically connected by the clear thermosetting resin and so forth. The top surface and the side-periphery of the scintillator block 3 and the side-periphery of the light guide 5 are respectively covered by the reflection film (not shown in FIG.) that reflects the scintillator lights.

The light detector 7 has the structure in which the photoelectric conversion layer 11 is layered on the upper-layer of the printed substrate 13 and the photoelectric conversion layer 11 and the light guide 5 are optically connected. Photoelectric conversion elements 11a are arranged two-dimensionally in the photoelectric conversion layer 11. Examples of the material applied to the photoelectric conversion element 11a are SiPM and APD and so forth, which have no influence from the magnetic field generated by the MR apparatus.

A light receiving element 11b is installed to the photoelectric conversion element 11a. The photoelectric conversion element 11a detects the scintillator lights transmitted by the light guide 5 by the light receiving element 11b and converts the scintillator lights to an electric signal. A plate-like ceramic and a plate-like glass epoxy resin and so forth are applied to the material forming the printed substrate 13.

The cooling layer 9 has the structure in which a thermal sheet 15 and the cooling plate 17 cooling the photoelectric conversion element 11a are layered in order. A structure having a tube (not shown in FIG.) in which a cooling medium circulates inside can be selected as a structure of the cooling plate 17. The thermal sheet 15 is formed with a material having a thermal conductivity and a high flexibility. The thermal sheet 15 adequately adheres the cooling plate 17 and the light detector 7 and allows heat to conduct efficiently from the photoelectric conversion element 11a to the cooling plate 17. The thermal sheet 15 corresponds to the thermal conductive sheet of the present invention. The cooling plate 17 corresponds to the cooling means of the present invention.

The cooling plate 17 diffuses adequately and effectively conducted heat. Therefore, the cooling plate 17 is contacting the light detector 7 through the thermal sheet 15 so that the photoelectric conversion element 11a can be cooled more efficiently. However, the cooling plate 17 may contact directly the light detector 7 without the thermal sheet 15.

One end of the connector 19 is connected to the backside (surface with no layered photoelectric conversion layer 11) of the printed substrate 13. The connector 19 penetrates the cooling layer 9 and the other end thereof connects the integrated circuit substrate 21. Specifically, relative to the radiation detector 1, the integrated circuit substrate 21 is apart from the cooling layer and in-place in the under-layer of the cooling layer 9. The connector 19 is made of a less thermal conductive material. The connector 19 corresponds to the connection element of the present invention.

The integrated circuit substrate 21 has the structure in which the printed substrate 23 and the integrated circuit 25 are layered from the upper-layer in order. The other end of the connector 19 connects the printed substrate 23. The connection base 27 is installed in the lower-layer of the integrated circuit 25. The connection base 27 connects a chassis 29, which is installed to the PET apparatus and enclosing the radiation detector 1, and the radiation detector 1. The inventor sets forth the detail of the entire PET apparatus later. The connection base 27 corresponds to the base element of the present invention.

The integrated circuit 25 sends the electric signal converted by the photoelectric conversion element 11a to a signal processing circuit to be read out. An application specific integrated circuit (ASIC) and so forth can be applied to the material forming the integrated circuit 25. The signal processing circuit generates a tomographic image showing the distribution of positron emission radionuclides at the target region based on the read-out electric signal.

<Characteristic Structure of the Embodiment>

The holding member 31 is installed to each outer-periphery of the scintillator block 3, the light guide 5, the light detector 7 and the connection base 27 as a characteristic structure of the radiation detector 1 according to the aspect of the Embodiment. The holding member 31 is made of a resin having an insulation property and the light shielding property and a black polycarbonate resin and a black ABS resin are preferable examples for the forming material. Such materials are the resins that have a less light transparency and can ensure the stable and precious shape.

Figure 2:
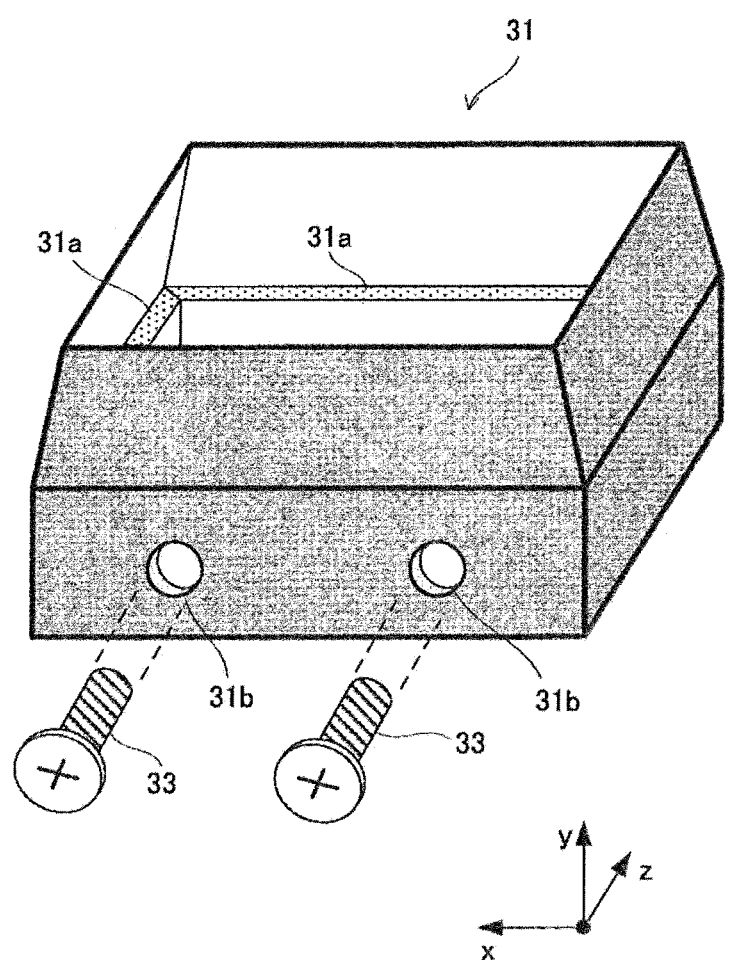
FIG. 2 is a perspective view illustrating a holding member according to the aspect of the Embodiment.

FIG. 2 is the perspective view of the holding member 31. The holding member 31 is an approximate rectangular parallelepiped having a penetrating opening in the y-direction. A connection element 31a and a gimlet hole 31b are installed to the holding member 31. The connection element 29a is formed as connecting the side surface of the light detector 7 and the bottom surface. The holding member 31 holds stably the light detector 7 through the connection element 31a, so that the location of the scintillator block 3 connecting the light detector 7 can be more stable.

Figure 3:
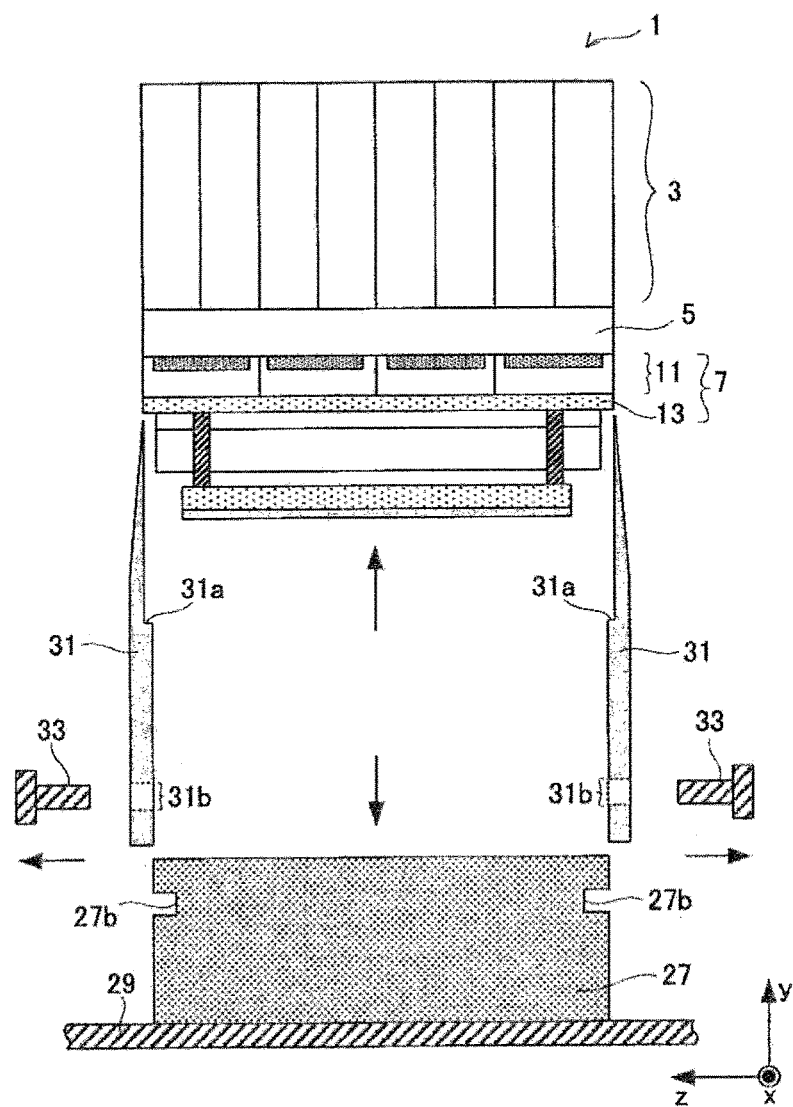
FIG. 3 is a vertical cross-section view illustrating a connected state of a composite of the holding member, a connection base and a scintillator according to the aspect of the Embodiment.

The gimlet hole 31b is installed to the side surface of the inferior part of the holding member 31 and each gimlet hole 31b penetrates the holding member 31 in the z-direction. The screw is screwed via the gimlet hole 31b, so that the holding member 31 and the connection base 27 are fastened. When the inside of the radiation detector 1 is inspected followed by repaired, the holding member 31 and the connection base 27 can be separated by removing the screw 33 from the gimlet hole 31b as demonstrated in FIG. 3. In addition, the holding member 31 and the light detector 7 which are connected through the connection element 31a can be separated by dismounting the screw 33. The gimlet hole 31b correspond to the base fastening element of the present invention.

In addition, the holding member 31 has the taper-shaped form being thicker from the upper end toward the bottom. Specifically, the holding member 31 has the taper-shaped form being thicker from the side-periphery of the scintillator block 3 toward the side surface installed to the side-periphery of the light detector 7. In such case, the adhesive area between the light shielding film 35, set forth later, and the holding member 31 becomes much larger, so that the holding member 31 and the light shielding film 35 can be fastened more strongly. Consequently, the fastening strength of the radiation detectors 1 can be much stronger.

Figure 4A:
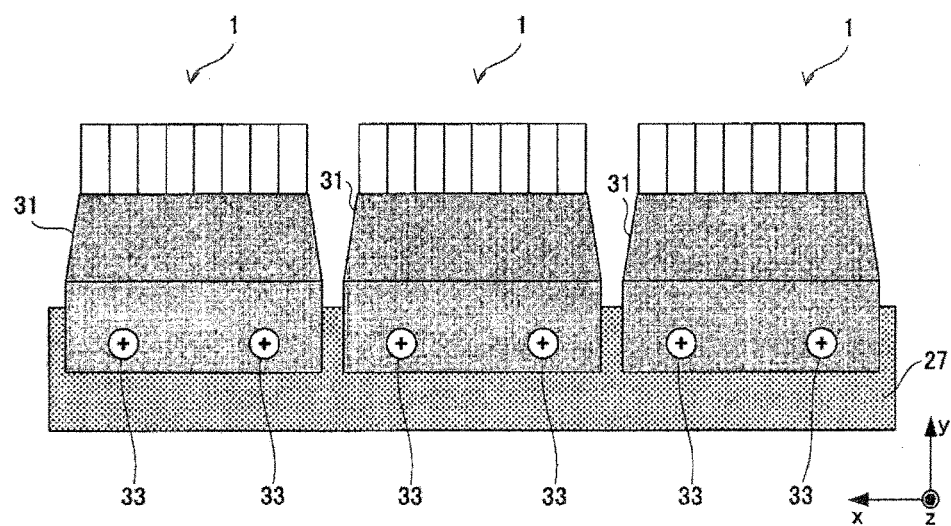
FIG. 4A, 4B are explanation views illustrating a constitution of the connection base of the Embodiment.
Figure 4B:
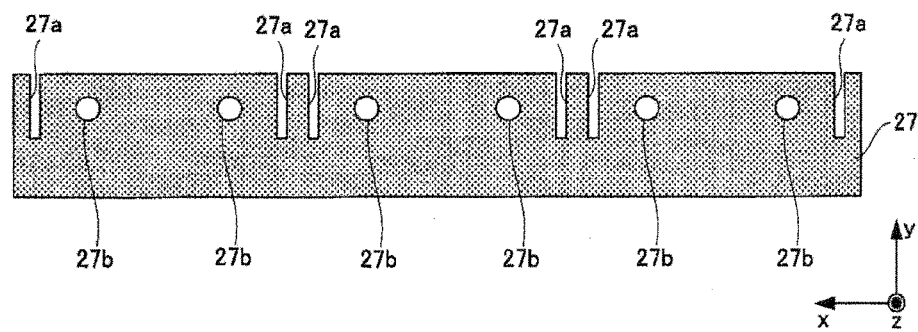

In addition, referring to FIG. 4A, the connection base 27 is extending in the x-direction and connects the respective three radiation detectors 1 arranged in a line in the x-direction. Referring to FIG. 4B, a concave element 27a is installed to the connection base 27 and the concave element 27a connects the bottom end of the holding member 31 installed to the radiation detector 1. In addition, the screw hole 27b screws with the screw 33 is installed to the surface of the connection base 27 in the z-direction. Specifically, the screw 33 is screwed with the screw hole 27 via the gimlet hole 31b, so that the holding member 31 and the connection base 27 are fastened.

Figure 5:
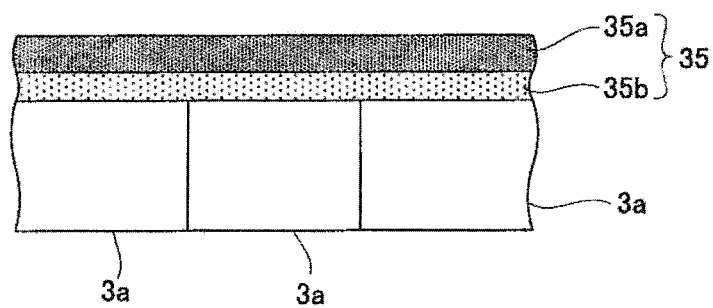
FIG. 5 is a vertical cross-section view illustrating a structure of a light shielding film according to the aspect of the Embodiment.

In addition, referring to FIG. 1, the top surface and the side-periphery of the scintillator block 3 and the side-periphery of the holding member 31 are covered by the light shielding film 35 as the characteristic structure of the radiation detector 1. Referring to FIG. 5, the light shielding film 35 has a two-layers structure formed by the light shielding layer 35a and the adhesive layer 35b. A material forming the light shielding layer 35a is preferably black polyethylene terephthalate (PET) and so forth. The black PET is the material capable of efficiently blocking lights despite a thin-film. In addition, PET has a high strength and a high insulation property despite the thin film, so that the light shielding film 35 can protect the radiation detector 1 from the impact shock and the outside lights. The light shielding film 35 corresponds to the light shielding member of the present invention.

The adhesive layer 35b is made of an adhesive material and a known adhesive agent can be applied. The light shielding layer 35a adheres and covers the scintillator block 3 or the holding member 31 through the adhesive layer 35b. The thickness of the light shielding layer 35a is e.g., 30 µm as an example, and the thickness of the adhesive layer 35b is e.g., 20 µm as an example. Specifically, even if the scintillator blocks 3 are covered by the light shielding film 35, the apart distance between the adjacent scintillator blocks 3 per se can be set ideally short even when the scintillator block 3 is covered by the light shielding member because the thickness of the light shielding film 35 is approximately 50 µm. In such way, the radiation detector 1 can be strongly fastened by the holding member 31 and the light shielding film 35. Consequently, the locational shift of the scintillator block 3 can be prevented.

<Structure of PET Apparatus>

Figure 7:
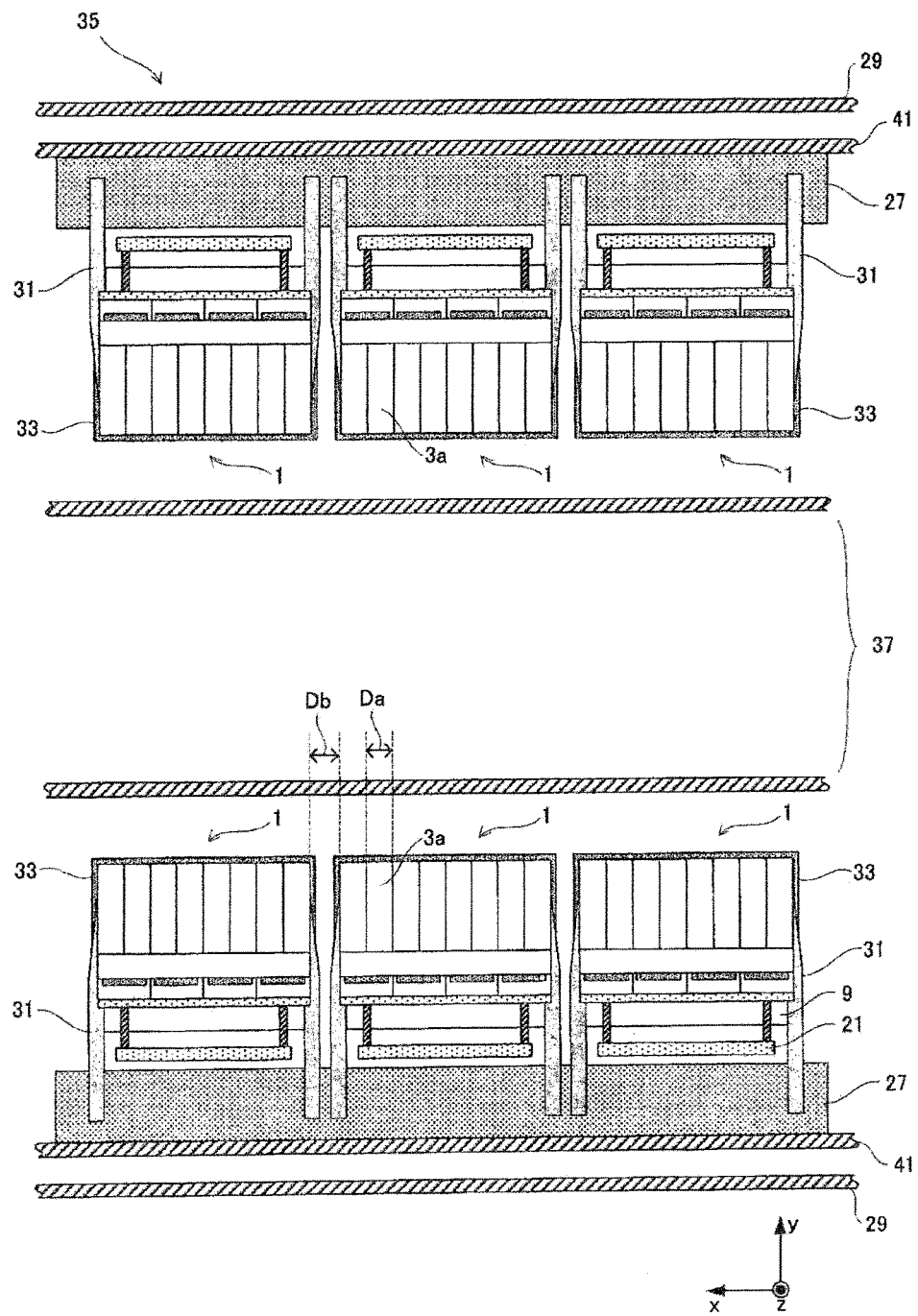
FIG. 7 is a vertical cross-section view of the xy-plane relative to the PET apparatus according to the aspect of the Embodiment.

Hereinafter, the inventor sets forth the structure of the PET apparatus comprising the radiation detector 1 according to the aspect of the Embodiment. FIG. 6A is the vertical cross-section view of the yz-plane relative to the PET apparatus 37, and FIG. 7 is the vertical cross-section view of the xy-plane relative to the PET apparatus 37.

The vertical cross-section view of the yz-plane of the PET apparatus 37 according to the aspect of the Embodiment 1 and the same of the conventional PET apparatus are in common. Specifically, the PET apparatus 37 comprises a gantry 41 having a hole 39 in which a subject is introduced. A chassis 43 is installed inside the gantry 41. The radiation detectors 1 are circularly arranged inside the chassis 43 as surrounding the hole 39. Referring to FIG. 6A, the number of the radiation detectors 1 is eight, but such number of radiation detectors 1 forming a ring-structural (annular shape structure) can be changed as needed.

The connection base 27 connects the respective radiation detectors 1 and the chassis 43. Referring to FIG. 7, the connection base 27 is arranged so that the long direction of the connection base 27 can coincide with the x-direction. Consequently, the three radiation detectors 1 connected to one connection base 27 are respectively in-place in a line of the x-direction. In addition, the number of the connection bases 27 arranged in the x-direction is not limited to one and multiple connection bases 27 can be arranged in the line of the x-direction.

Now, the array pitch of scintillator crystals 3a in the scintillator block 3 is specified as Da in the radiation detector 1. In addition, the apart distance between the upper ends per se is Db in the adjacent scintillators block 3 to each other. The apart distance Db is preferably an integral multiplication of the array pitch Da relative to the radiation detectors 1.

In such case, the respective radiation detectors 1 are arranged as if the scintillator crystals 3a in a perfect array are surrounding the whole of the hole 39. In addition, the shorter apart distance Db is preferable to increase further the detection sensitivity of the γ-ray. The array pitch Da of scintillator crystals 3a is e.g., approximately 1 mm, as an example, in the radiation detector 1. In such case, the ideal distance of the apart distance Db is 3 mm as an example.

(Effects of the Aspect of the Embodiment 1)

In accordance with the above aspects, the radiation detector 1 according to the aspect of the Embodiment 1 can increase the cooling efficiency relative to the photoelectric conversion element and enhance the fastening strength of the detectors. Hereinafter, the inventor sets forth effects due to the structure according to the aspect of the Embodiment.

The radiation detectors 1 according to the aspect of the Embodiment includes the holding member 31 and the light shielding film 35. The connection element 31a is installed to the holding member 31 and the connection element 31a is formed as connecting the side surface of the light detector 7 and the bottom surface. Specifically, the holding member 31 holds the side-surface and the bottom surface of the light detector 7 by the connection element 31a.

The radiation detector 1 comprises a layered structure (scintillator composite) in which the scintillator block 3, the light guide 5, the light detector 7 and the cooling layer 9 are layered in order. The respective layers forming the scintillator composite are strongly connected, respectively. Consequently, the connection element 31a holds the light detector 7, so that the holding member 31 can prevent the incident of the location shift of the scintillator composite. Particularly, the connection element 31a can hold the bottom surface of the light detector 7, so that the holding member 31 can adequately and effectively prevent the incident in which the scintillator composite shifts toward the lower-layer relative to the x-direction.

Figure 10A:
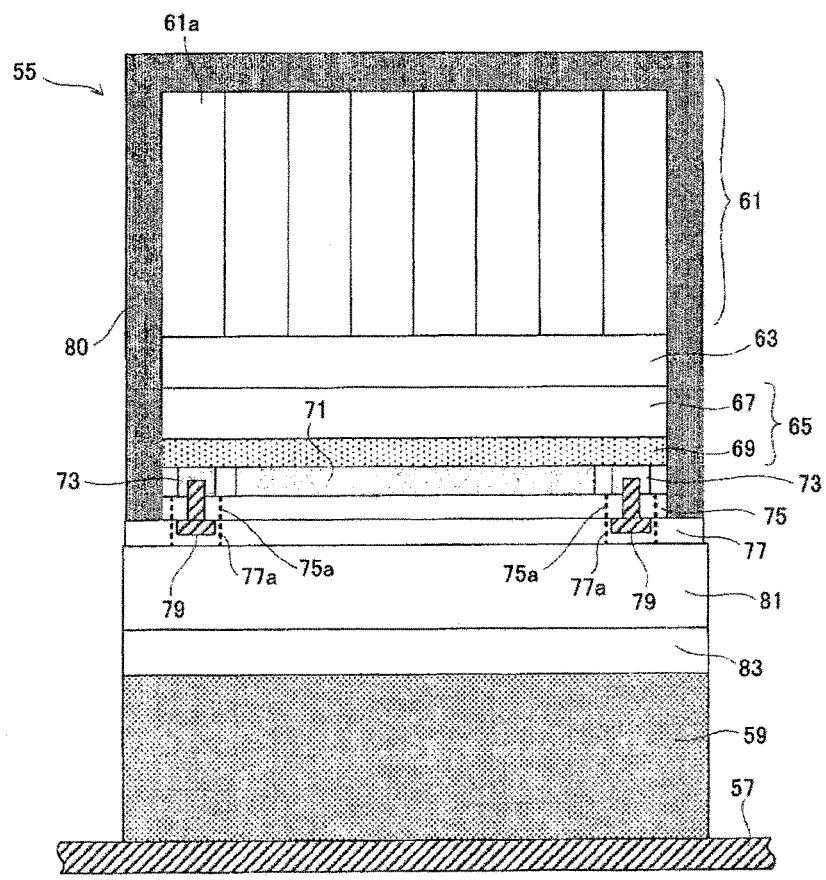
FIG. 10A, 10B are schematic views illustrating an entire structure of a radiation detector according to the aspect of the conventional example.
Figure 10B:
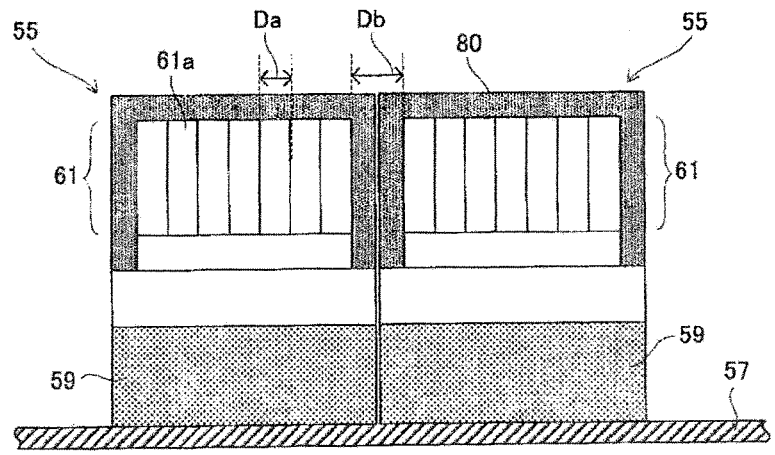

The gimlet holes 31b are installed to the holding member 31. The holding member 31 holding the scintillator composite connects the connection base 27 by screwing the gimlet hole 31b and the screw 33. According to the conventional radiation detector 55, the screw hole 73 is installed to the surface of the printed substrate 69 of which the most part is occupied by the integrated circuits 71, so that the installable area for the screw hole is limited (narrow). Consequently, the conventional radiation detector 55 hardly ensures the sufficient fastening force because the number of screws 79 and the size thereof are limited (FIG. 10A).

In contrast, according to the aspect of the Embodiment, the gimlet holes 31b are installed to the inferior side surface of the holding member 31. Referring to FIG. 6A, the radiation detectors 1 are circularly arranged relative to the yz-plane. Relative to the radiation detectors 1 applied to the PET apparatus, the apart distance between the adjacent scintillator blocks 3 is preferable as short as possible to further increase the detection sensitivity for γ-rays. Therefore, the respective radiation detectors 1 are in-place so that the apart distance Db in the z-direction at the upper-layer of the radiation detectors 1 can take the predetermined short distance (e.g., 3 mm).

The respective radiation detectors 1 are, however, in-place as radially-expanding from the upper-layer to the lower-layer in the y-direction. Accordingly, the apart distance Dc at the lower-layer of the radiation detectors 1 in the z-direction gets longer than the apart distance Db at the upper-layer of the radiation detectors. The gimlet holes 31b are installed to the lower-layer of the radiation detector 1 as penetrating the holding member 31 in the z-direction. Therefore, the thickness of the holding member 31 and the size of the screw 33 can be thicker and larger respectively at the lower-layer of the radiation detector 1.

In addition, the inferior side surface of the holding member 31 is broad and no other component (e.g., integrated circuit) limiting the installation of the gimlet hole 31b occupies such surface, so that the area available for installation of the gimlet hole 31b can be larger. In such case, the number of the screws 33 can be increased and the gauge (diameter) thereof can be bigger. Consequently, the holding member 31 and the connection base 27 can be further strongly fastened by the gimlet hole 31b and the screw 33. In addition, the location of the gimlet hole 31b is far from the light detector 7 and the integrated circuit substrate 21, so that the influence of the magnetic field against the radiation detector 1 due to the screw and so forth can be much less.

Further, the holding member 31 and the scintillator block 3 are covered by the light shielding film 35. The light shielding film 35 is made of the material having an adhesive force, so that the light shielding film 35 can respectively and strongly connect the holding member 31 and the scintillator block 3. The light shielding film 35 connects and fixes the holding member 31 and the scintillator composite in a unified manner while winding. Accordingly, the radiation detector 1, as a whole, can have a robust fastening-strength. In addition, the light shielding film 35 covers adhesively the scintillator composite, so that the incident of the location shift thereof can be prevented. Particularly, the light shielding film 35 can adequately and effectively prevent the incident in which the scintillator composite shifts toward the upper-layer relative to the y-direction.

The light shielding film 35 is made of the black PET film. The black PET is the material having high strength and the light shielding property despite the thin-film so that the thickness of the light shielding film 35 can be cut to approximately 50 μm. Specifically, the apart distance Db between the adjacent scintillator blocks 3 per se can be set up ideally short even when the top surface of the scintillator blocks 3 is covered by the reflection film and the light shielding film 35. Consequently, the high detection sensitivity of γ-rays can be sustained while both resistance of the radiation detector 1 against the impact shock and light blocking property are being improved.

Both holding member 31 and light shielding film 35 are made of a material having the less light-permeability. While the holding member 31 covers and holds the side surface of the scintillator composite, in addition, the light shielding film 35 connects and fixes the holding member 31 and the scintillator composite in a unified manner while winding. Consequently, outside lights of the radiation detectors 1 can be adequately and effectively blocked by the holding member 31 and the light shielding film 35. Accordingly, the radiation detector 1 can further reduce the effect of outside lights. In addition, both holding member 31 and light shielding film 35 are made of a plastic, so that the radiation detector 1 can be adequately and effectively protected from the impact shock and so forth.

In addition, the holding member 31 has the taper-shaped form being thicker from the upper-layer toward the lower-layer. Specifically, the holding member 31 has the taper-shaped form being thicker from the side-periphery of the scintillator block 3 toward the side surface installed to the side-periphery of the light detector 7. In such case, the gap generated between the light shielding film 35 and the holding member 31 is narrow compared with the case in which the thickness of the holding member 31 is constant. Therefore, the holding member 31 and the light shielding film 35 can be more adhesive to each other and connected strongly. Consequently, the fastening strength of the radiation detectors 1 can be much stronger.

In such way, the radiation detector 1 can be strongly fastened by including the holding member 31 and the light shielding film 35. In addition, the locational shift of the scintillator composite can be adequately and effectively prevented, so that the radiation detector 1 can detect the data of γ-rays more accurately.

In addition, relative to the radiation detector 1 according to the aspect of the Embodiment, the light detector 7 and the cooling layer 9 are layered under tightly adhered condition to each other. Consequently, the respective photoelectric conversion elements 11a installed to the light detector 7 can be adequately and effectively cooled by the cooling plate 17. The integrated circuit substrate 21, which is a main heat source, is placed apart from the cooling layer 9. Therefore, heat generated at the integrated circuit substrate 21 can be adequately and effectively prevented to be conducted to the cooling layer 9. Consequently, the cooling efficiency of the cooling plate 17 for the photoelectric conversion element 11a can be effectively improved. In such case, the cooling plate 17 must not be strongly cooled, so that an incident of dew due to supercooling of the cooling plate 17 can be prevented in the radiation detector 1.

The present invention is not limited to the aspect of the Embodiments set forth above and another alternative Embodiment can be implemented set forth below.

Figure 8:
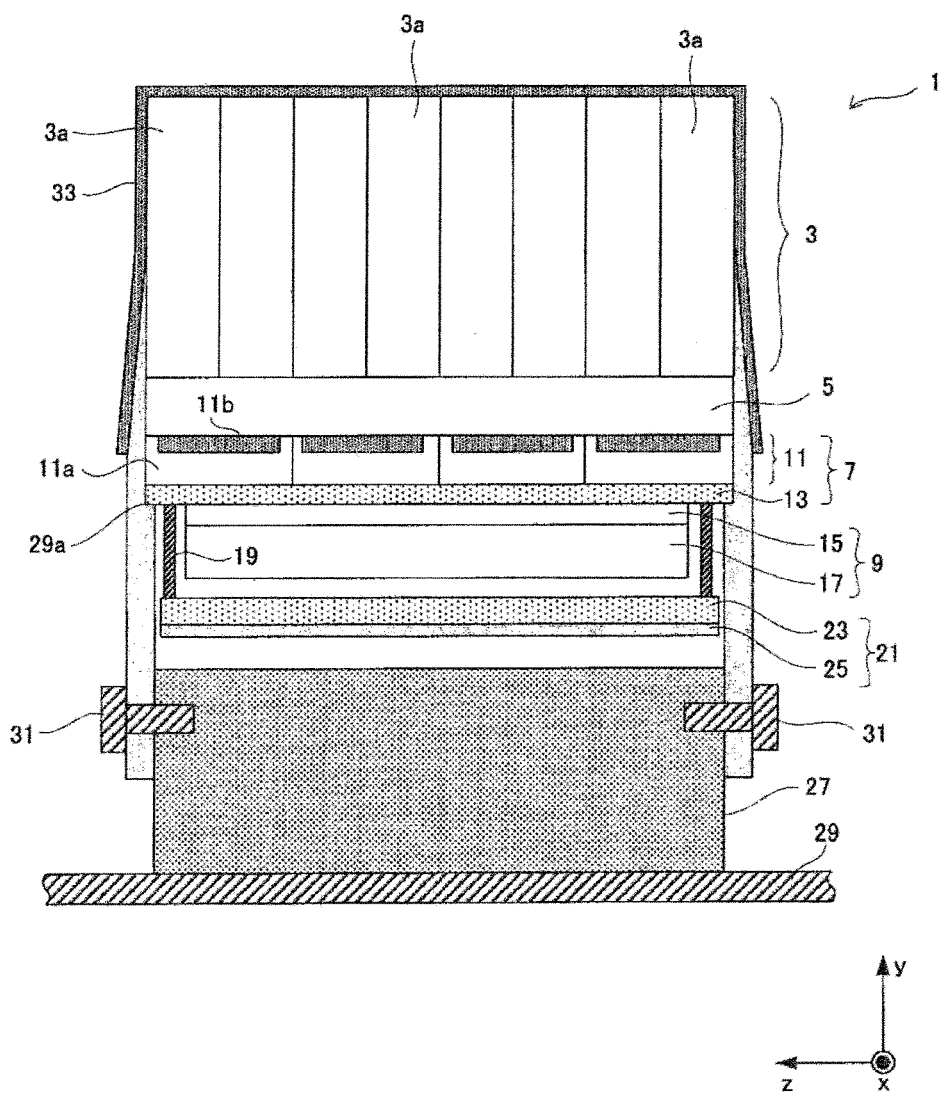
FIG. 8 is a vertical cross-section view illustrating an entire structure of a radiation detector according to the aspect of the alternative Embodiment.

(1) According to the aspect of the Embodiment as set forth above, the connector 19 penetrates the cooling layer 9, but the present invention is not limited thereto. Specifically, referring to FIG. 8, the connector 19 may be constructed as bypassing the side-periphery of the cooling layer 9 and extending therealong. In such case, no penetration hole is required for the thermal sheet 15 and the cooling plate 17. Consequently, the cooling efficiency of the cooling plate 17 for the photoelectric conversion element 11a can be much higher.

(2) According to the aspect of the Embodiment as set forth above, the holding member 31 has the taper-shape, but the shape thereof is not limited thereto and the holding member 31 may have the even thickness from the top end to the bottom end. In addition, the upper end of the holding member 31 connects the side-periphery of the scintillator lights, but the upper end of the holding member 31 may connect the side-periphery of the light detector 7 or the side-periphery of the light guide 5.

(3) According to the aspect of the Embodiment as set forth above, the radiation detector 1 is applied to the PET apparatus applicable for the PET-MR apparatus, but the application thereof is not limited thereto. Specifically, the radiation detector 1 according to the aspect of the Embodiment, is applicable for a TOF-PET (Time-of-Flight PET) apparatus other than the PET apparatus.

According to the TOF-PET apparatus, relative to the two γ-rays, a difference between times of flight from the emission position to the detection positions by both radiation detectors is measured, so that the emission positions of the γ-rays can be identified. When the radiation detector 1 is applied to the TOF-PEE, the scintillator block 3 are formed by the three-dimensionally arranged block scintillator crystals 3a. In such ease, the scintillator block 3 can discriminate the position of the light source of the scintillator light in the depth direction.

REFERENCE OF SIGNS

1 Radiation detector
3 Scintillator block
5 Light guide
7 Light detector
9 Cooling layer
11 Photoelectric conversion layer
11a Photoelectric conversion element
15 Thermal sheet (Thermal conductive sheet)
17 Cooling plate (Cooling means)
19 Connector (Connection element)
21 Integrated circuit substrate
25 Integrated circuit
27 Connection base (Base element)
29 Chassis (Steel case)
31 Holding member
31a Connection element
31b Gimlet hole (Base connection members)
33 Screw
35 Light shielding film (Light shielding members)*

As discussed herein, a "computer-system" may comprise an input device for receiving data, an output device for outputting data in tangible form (e.g. printing or displaying on a computer screen or transmitting data or calculating a value, etc. and without limitation), a tangible and temporary or permanent memory for storing data as well as computer code or applications, and a microprocessor for executing computer code wherein said computer code resident in said permanent memory will physically cause said microprocessor to read-in data via said input device, process said data within said microprocessor and output said processed data via said output device.

It will be further understood by those of skill in the art that the apparatus and devices and the elements herein, without limitation, and including the sub components such as operational structures, circuits, elements, modules, communication pathways, and related elements, control elements of all kinds, display circuits and display systems and elements, any necessary driving elements, inputs, sensors, detectors, memory elements, processors and any combinations of these structures etc. as will be understood by those of skill in the art as also being identified as or capable of operating the systems and devices and subcomponents noted herein and structures that accomplish the functions without restrictive language or label requirements since those of skill in the art are well versed in related diagnostic detectors, computer and operational controls and technologies of radiographic devices and all their sub components, including various circuits and combinations of circuits without departing from the scope and spirit of the present invention.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Those of skill would further appreciate that the various illustrative logical blocks, modules, circuits, and algorithm steps described in connection with the embodiments disclosed herein may be implemented as electronic hardware, computer software running on a specific purpose machine that is programmed to carry out the operations described in this application, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general or specific purpose processor, or with hardware that carries out these functions, e.g., a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has an internal bus connecting to cards or other hardware, running based on a system BIOS or equivalent that contains startup and boot software, system memory which provides temporary storage for an operating system, drivers for the hardware and for application programs, disk interface which provides an interface between internal storage device(s) and the other hardware, an external peripheral controller which interfaces to external devices such as a backup storage device, and a network that connects to a hard wired network cable such as Ethernet or may be a wireless connection such as a RF link running under a wireless protocol such as 802.11. Likewise, an external bus may be any of but not limited to hard wired external busses such as IEEE-1394 or USB. The computer system can also have a user interface port that communicates with a user interface, and which receives commands entered by a user, and a video output that produces its output via any kind of video output format, e.g., VGA, DVI, HDMI, display port, or any other form. This may include laptop or desktop computers, and may also include portable computers, including cell phones, tablets such as the IPAD™ and Android™ platform tablet, and all other kinds of computers and computing platforms.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non-transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A radiation detector, comprising:
   a scintillator block that comprises two-dimensionally arranged block scintillator crystals and detects an incident radiation and emits light;
   a light guide that is photochemically connected to said scintillator block and transmits said light emitted from said scintillator block;
   a light detector that is photochemically connected to said light guide and comprises a photoelectric conversion element for converting the light transmitted from said light guide to an electric signal;

a holding member having a connection element that is installed to the respective side-peripheries of said light detector, said light guide and said scintillator block and connects and holds said side-peripheries of said light detector and a bottom and a base fastening element that is fastened with base elements installed to the location facing said scintillator block and sandwiching said light detector; and a light shielding thin-film member having an adhesive property that covers the outer-periphery of said scintillator block and the side-periphery of said holding member.

2. The radiation detector, according to claim 1, comprising:

a cooling layer that is tightly connected to said light detector, wherein said cooling layer comprises a cooling means that cools said photoelectric conversion elements;

an integrated circuit substrate that comprises a integrated circuit that sends the electric signal converted by said photoelectric conversion element; and wherein said integrated circuit substrate is connected to said light detector through a connection element and placed in a non-contact location of said cooling layer.

3. The radiation detector, according to claim 2, wherein:
said cooling layer that comprises said cooling means and a thermal conductive sheet made of a thermal conductive resin; and
said cooling means is tightly connected to said light detector through said thermal conductive sheet.

4. The radiation detector, according to claim 1, wherein:
said photoelectric conversion element is a SiPM element or an ADP element.

5. The radiation detector, according to claim 1, wherein:
said light shielding member comprises a light shielding layer made of black polyethylene terephthalate and an adhesive layer made of a adhesive material; and
said light shielding member covers the outer-periphery of said scintillator block and the side-periphery of said holding member through said adhesive layer.

6. The radiation detector, according to claim 1, wherein:
said holding member has a taper-shaped form being thicker from the side-periphery of said scintillator block toward the side-periphery of said light detector.

7. The radiation detector, according to claim 1, wherein:
said holding member is made of a resin having an insulation property and the light shielding property.

* * * * *